(12) United States Patent
Sasaki et al.

(10) Patent No.: US 7,618,562 B2
(45) Date of Patent: Nov. 17, 2009

(54) THERMOELECTRIC MATERIAL

(75) Inventors: Masahiro Sasaki, Yasu (JP); Takanori Nakamura, Oumihachiman (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/331,686

(22) Filed: Dec. 10, 2008

(65) Prior Publication Data
US 2009/0134365 A1    May 28, 2009

Related U.S. Application Data

(63) Continuation of application No. PCT/JP2007/058840, filed on Apr. 24, 2007.

(30) Foreign Application Priority Data

Jun. 15, 2006    (JP) .............................. 2006-166369

(51) Int. Cl.
*H01B 1/08* (2006.01)
*H01L 35/22* (2006.01)
*C04B 35/00* (2006.01)

(52) U.S. Cl. .................................. 252/521.2; 136/236.1

(58) Field of Classification Search ............... 252/518.1, 252/521.3, 521.2; 136/236.1, 241
See application file for complete search history.

(56) References Cited

U.S. PATENT DOCUMENTS 5,055,140 A * 10/1991 Kumada et al. ............. 136/212

FOREIGN PATENT DOCUMENTS

| JP | 1-93182 | 4/1989 |
| JP | 8-55706 | 2/1996 |
| JP | 2000-211971 | 8/2000 |

OTHER PUBLICATIONS

Trollund et al "Cation distribution and electrochemical behavior of copper nickel manganese oxide (CuxNi0.6-0.2xMn2.4-0.8xO4)", Electrochimica Acta (1990), 35(8), 1303-10. Abstract Only.*
Toepfer et al "Investigations on the electronically conducting oxide systems XXIV: preparation and electrical proerties of the spinel series CuzNiMn2-zO4", Solid State Ionics (1993), 59(3-4), 249-56.*
Metz et al "Intergranular phases in electroceramics", Journal de Physique, Colloque (1990), Cl, Interganular Interphase Boundaries Mater.), C1-1003/C1-1008. Abstract Only.*
Gurav et al "Synthesis, characterization and catalyic CO oxidation studies over Ni1-xCuxMn2O4", Indian Journal of Chemistry, Section A: (1999), 38A(2), 130-135. Abstract Only.*
Kukuruznyak et al "Combinatorial screening of ternary NiO-Mn2O3-CuO composition spreads", Journal of Applied Physica 98, 043710 1-4. (2005).*
PCT/JP2007/058840 International Search Report dated May 29, 2007.
PCT/JP2007/058840 Written Opinion dated May 29, 2007.

* cited by examiner

*Primary Examiner*—Mark Kopec
(74) *Attorney, Agent, or Firm*—Dickstein, Shapiro, LLP.

(57) ABSTRACT

A p-type oxide thermoelectric material which has a high output factor and a low environmental load. The thermoelectric material is composed of an oxide represented by the compositional formula $(Ni_{1-x}Cu_x)(Mn_{2-y}Cu_y)O_4$ and having a structure in which Ni elements occupying the Ni sites and/or Mn elements occupying the Mn sites are partially replaced by Cu elements, wherein $0 \leq x \leq 0.7$, $0 \leq y \leq 0.7$, and $0.4 \leq x+y$. In such a thermoelectric material, preferably, $0.2 \leq x \leq 0.5$ and $0.2 \leq y \leq 0.5$, and preferably, the output factor at 50° C. to 800° C. is $10 \times 10^{-6}$ W/mK$^2$ or more.

9 Claims, 2 Drawing Sheets

THERMOELECTRIC MATERIAL

CROSS REFERENCE TO RELATED APPLICATIONS

The present application is a continuation of International Application No. PCT/JP2007/058840, filed Apr. 24, 2007, which claims priority to Japanese Patent Application No. JP2006-166369, filed Jun. 15, 2006, the entire contents of each of these applications being incorporated herein by reference in their entirety.

FIELD OF THE INVENTION

The present invention relates to a composition of a thermoelectric material, and more particularly relates to a p-type oxide thermoelectric material.

BACKGROUND OF THE INVENTION

Japanese Unexamined Patent Application Publication No. 1-93182 (hereinafter referred to as "Patent Document 1") describes a thermoelectric element in which n-type semiconductor members and p-type semiconductor members are connected in series and which, as a whole, has a large thermoelectromotive force. In this element, insulating layers and conductor layers are formed on opposite surfaces of adjacent n-type and p-type semiconductor plate members, and then the plate members are stacked. Consequently, the adjacent plate members are insulated from each other by the insulating layers at portions where connection is not required, and are electrically connected to each other by the conductor layers at portions where connection is required. Therefore, a complicated connection operation using lead wires is not required. Furthermore, the plate members are stacked after the insulating layers and the conductor layers are formed thereon by thick-film printing, and the insulating layers and the conductor layers join the plate members by firing. Consequently, the insulating layers and the conductor layers exhibit the function of joining the plate members in addition to the original functions of electrical insulation and connection. The thermoelectric element is composed of n-type semiconductor plate members and p-type semiconductor plate members and has a structure in which a plurality of plate members are stacked. Consequently, even if many n-type semiconductor members and p-type semiconductor members are combined, the entire element can be reduced in size or miniaturized, and its thermal capacity can be reduced so that temperature gradients can be sensitively detected.

Patent Document 1 discloses a case in which a Ba—Ti-based oxide is used as the n-type semiconductor, and a Ni—Mn—Cu-based oxide is used as the p-type semiconductor, and in its example, a p-type semiconductor prepared by adding CuO to $NiMn_2O_4$ is used.

Patent Document 1: Japanese Unexamined Patent Application Publication No. 1-93182

However, the Seebeck coefficient of a Ni—Mn—Cu—O material, which is the p-type semiconductor in the example of Patent Document 1, is −160 μV/K at 20° C., and in order to use the material as a useful thermoelectric material, it is necessary to further increase the thermoelectromotive force.

SUMMARY OF THE INVENTION

It is an object of the present invention to provide a Ni—Mn—Cu—O-based oxide thermoelectric material which has a high output factor and a low environmental load.

A thermoelectric material according to the present invention is characterized by being composed of an oxide represented by the compositional formula $(Ni_{1-x}Cu_x)(Mn_{2-y}Cu_y)O_4$ and having a structure in which Ni elements occupying the Ni sites and/or Mn elements occupying the Mn sites are partially replaced by Cu elements, wherein $0 \leq x \leq 0.7$, $0 \leq y \leq 0.7$, and $0.4 \leq x+y$. In such a thermoelectric material, preferably, $0.2 \leq x \leq 0.5$ and $0.2 \leq y \leq 0.5$, and preferably, the output factor at 50° C. to 800° C. is $10 \times 10^{-6}$ W/mK$^2$ or more.

According to the present invention, it is possible to provide, using a Ni—Mn—Cu—O-based compound, a p-type oxide thermoelectric material having a low resistivity, a high Seebeck coefficient, and a high output factor. Furthermore, it is possible to provide a thermoelectric conversion element which is toxic element-free and safe.

DETAILED DESCRIPTION OF THE INVENTION

Figure 1:
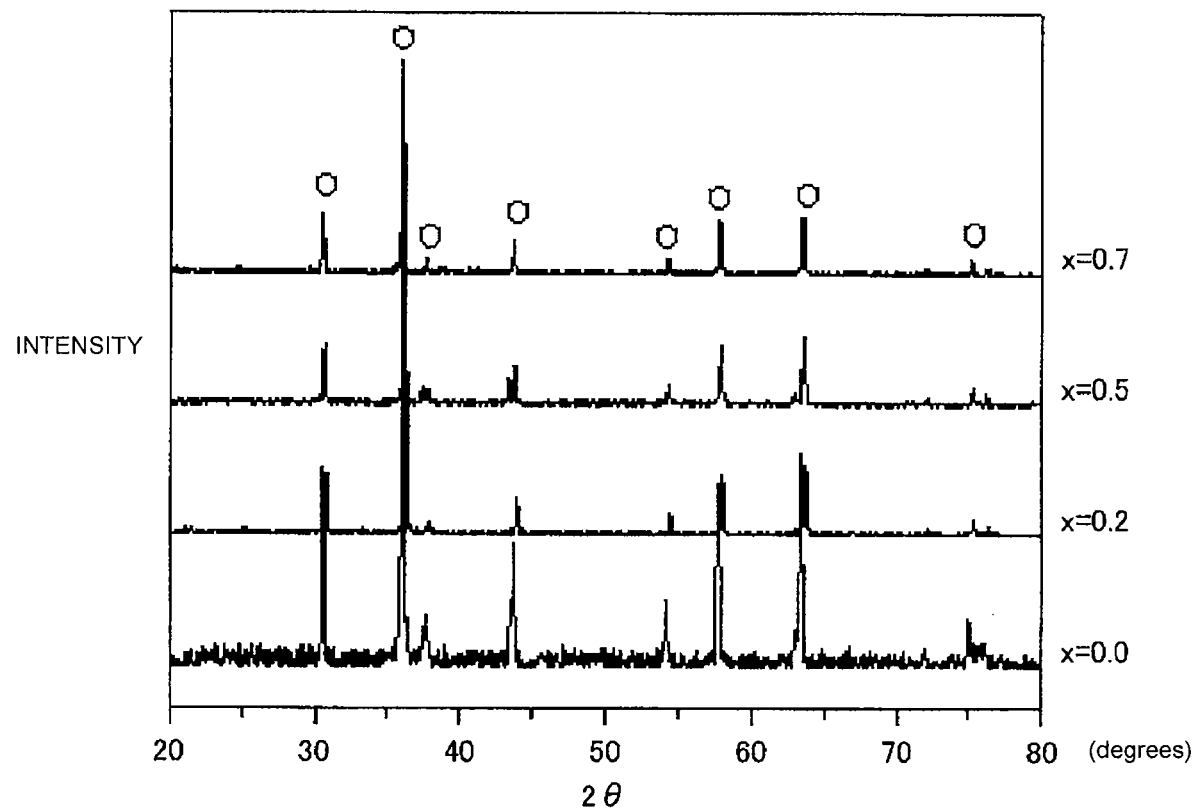
FIG. 1 is an XRD chart of the sintered bodies prepared in Example of the present invention.

A thermoelectric material of the present invention is composed of an oxide having a spinel structure represented by $(Ni_{1-x}Cu_x)(Mn_{2-y}Cu_y)O_4$, in which Ni elements occupying the Ni sites and Mn elements occupying the Mn sites are partially replaced by Cu elements, or Ni elements occupying the Ni sites or Mn elements occupying the Mn sites are partially replaced by Cu elements, wherein $0 \leq x \leq 0.7$, $0 \leq y \leq 0.7$, and $0.4 \leq x+y$. By partially replacing the Ni sites and/or the Mn sites by Cu elements, the electrical resistivity of the thermoelectric material decreases and the Seebeck coefficient increases, and thereby it is possible to provide a p-type oxide thermoelectric material having a high output factor. Furthermore, the thermoelectric material does not contain in its composition a toxic element, and thus has a low environmental load.

From the standpoint of increasing the output factor of the thermoelectric material, $0 \leq x$, and preferably $0.2 \leq x$. From the same standpoint, $0 \leq y$, and preferably $0.2 \leq y$. Furthermore, from the standpoint of facilitating firing and increasing the mechanical strength of the thermoelectric material, $x \leq 0.7$, and preferably $x \leq 0.5$. From the same standpoint, $y \leq 0.7$, and preferably $y \leq 0.5$. Moreover, from the standpoint of increasing the output factor of the thermoelectric material, $0.4 \leq x+y$, preferably $0.5 \leq x+y$, and more preferably $0.7 \leq x+y$. From the same standpoint, preferably $x+y \leq 1.2$, and more preferably $x+y \leq 1.0$. Furthermore, a thermoelectric material of the present invention in which the output factor at 50° C. to 800° C. is $10 \times 10^{-6}$ W/mK$^2$ or more is preferable because of high output and from the standpoint that the temperature dependence of the output factor is low.

EXAMPLES

Powders of oxides of Ni, Mn, and Cu were prepared as raw material powders. Then, these powders were weighed so as to produce a compound oxide represented by the general formula $(Ni_{1-x}Cu_x)(Mn_{2-y}Cu_y)O_4$, wherein $0 \leq x \leq 0.7$, $0 \leq y \leq 0.7$, and $0.4 \leq x+y$. In the same manner as above, Comparative Example 1 (x=0.0, y=0.2), Comparative Example 2 (x=0.2, y=0.0), Comparative Example 3 (x=0.9, y=0.0), and Comparative Example 4 (x=0.0, y=0.9) were prepared. Note that the raw material powders are not limited to the oxides described above, and other inorganic materials, such as carbonates and hydroxides, or organometallic compounds, such as acetylacetonate complexes, may be used.

The weighed raw material powders were pulverized and mixed with a wet ball mill using $H_2O$ as a solvent, and the resulting slurry containing the raw material powders was dried, thereby to obtain mixed powder. Next, the mixed powder was subjected to heat treatment in an air atmosphere at 950° C. for 2 hours, thereby to obtain an intended thermoelectric oxide powder. An organic binder was added to each of the resulting composition powders in an amount of 5% by mass on the basis of the composition powder, and then pulverization and mixing were performed with a wet ball mill using $H_2O$ as a solvent. Then, after each of the composition powders into which the organic binder was added was dried thoroughly, shaped bodies were formed with a single-axis press at a pressure of 1 kN/cm². The shaped bodies were fired in an air atmosphere in a range of 950° C. to 1,100° C. for 2 hours, thereby to obtain sintered bodies. The firing temperature differed depending on the Cu content in each of the composition powders, and was set such that the relative density was 80% or more, preferably 90% or more.

The crystal structure of the resulting sintered bodies was identified by X-ray diffraction (XRD). As a result, all of the sintered bodies had a crystal structure having a spinel structure as a main component. FIG. 1 is an XRD chart with respect to $(Ni_{1-x}Cu_x)(Mn_{2-y}Cu_y)O_4$ wherein x=0.0 to 0.7 and y=0.5 among the sintered bodies prepared in this example. In FIG. 1, the peak marked by a circle corresponds to a peak characteristic to $NiMn_2O_4$ having the spinel structure.

Next, the output factor of the resulting sintered bodies was measured. With respect to the thermoelectric properties, first, the resistivity was determined by a method in which each of the sintered bodies of the compositions was placed in a temperature controlled chamber set at 50° C. to 800° C., the resistance of the sample was measured by a DC four-terminal method at each measurement temperature, and on the basis of the size of the sample, the resistivity was calculated. Furthermore, the Seebeck coefficient was determined by a method in which each of the sintered bodies of the compositions was placed in a temperature controlled chamber set at 50° C. to 800° C. in the same manner as above, the temperatures of both ends of the sample were adjusted so that a high-temperature portion and a low-temperature portion were obtained, the thermoelectromotive force generated was measured, and on the basis of the difference in measurement temperature, the Seebeck coefficient was calculated. Next, the conductivity ($\sigma$) was calculated from the measured resistivity, and on the basis of the conductivity and the Seebeck coefficient (S), the output factor=$S^2 \cdot \sigma$ was calculated. Table 1 shows the compositional ratios and the physical properties of the compositions. In Table 1, the data at the measurement temperature at which the output factor had the maximum value is shown for each compositional ratio. Furthermore, as in Comparative Examples 3 and 4, when x>0.7 or y>0.7, sinterability was low, and measurement could not be made.

TABLE 1

| | Compositional ratio | | | Physical properties of composition | | | |
|---|---|---|---|---|---|---|---|
| | | | | Measurement temperature | Resistivity | Seebeck coefficient | Output factor |
| | x | y | x + y | (° C.) | ($\Omega \cdot$ cm) | ($\mu$V/K) | ($\times 10^{-6}$) (W/mK²) |
| Comparative Example 1 | 0.0 | 0.2 | 0.2 | 783 | 0.0354 | 42 | 5 |
| Example 1 | 0.0 | 0.5 | 0.5 | 344 | 0.0252 | 129 | 66 |
| Example 2 | 0.0 | 0.7 | 0.7 | 348 | 0.0158 | 139 | 122 |
| Comparative Example 2 | 0.2 | 0.0 | 0.2 | 780 | 0.0305 | 38 | 5 |
| Example 3 | 0.2 | 0.2 | 0.4 | 343 | 0.0582 | 120 | 25 |
| Example 4 | 0.2 | 0.5 | 0.7 | 344 | 0.0152 | 117 | 90 |
| Example 5 | 0.2 | 0.7 | 0.9 | 344 | 0.0177 | 131 | 96 |
| Example 6 | 0.5 | 0.0 | 0.5 | 572 | 0.0147 | 66 | 30 |
| Example 7 | 0.5 | 0.2 | 0.7 | 460 | 0.0162 | 98 | 59 |
| Example 8 | 0.5 | 0.5 | 1.0 | 343 | 0.0135 | 171 | 215 |
| Example 9 | 0.5 | 0.7 | 1.2 | 344 | 0.0169 | 159 | 149 |
| Example 10 | 0.7 | 0.0 | 0.7 | 575 | 0.0088 | 83 | 78 |
| Example 11 | 0.7 | 0.2 | 0.9 | 460 | 0.0115 | 99 | 88 |
| Example 12 | 0.7 | 0.5 | 1.2 | 463 | 0.0111 | 118 | 125 |
| Example 13 | 0.7 | 0.7 | 1.4 | 461 | 0.0191 | 129 | 87 |
| Comparative Example 3 | 0.9 | 0.0 | | Low sinterability, unable to measure | | | |
| Comparative Example 4 | 0.0 | 0.9 | | Low sinterability, unable to measure | | | |

Figure 2:
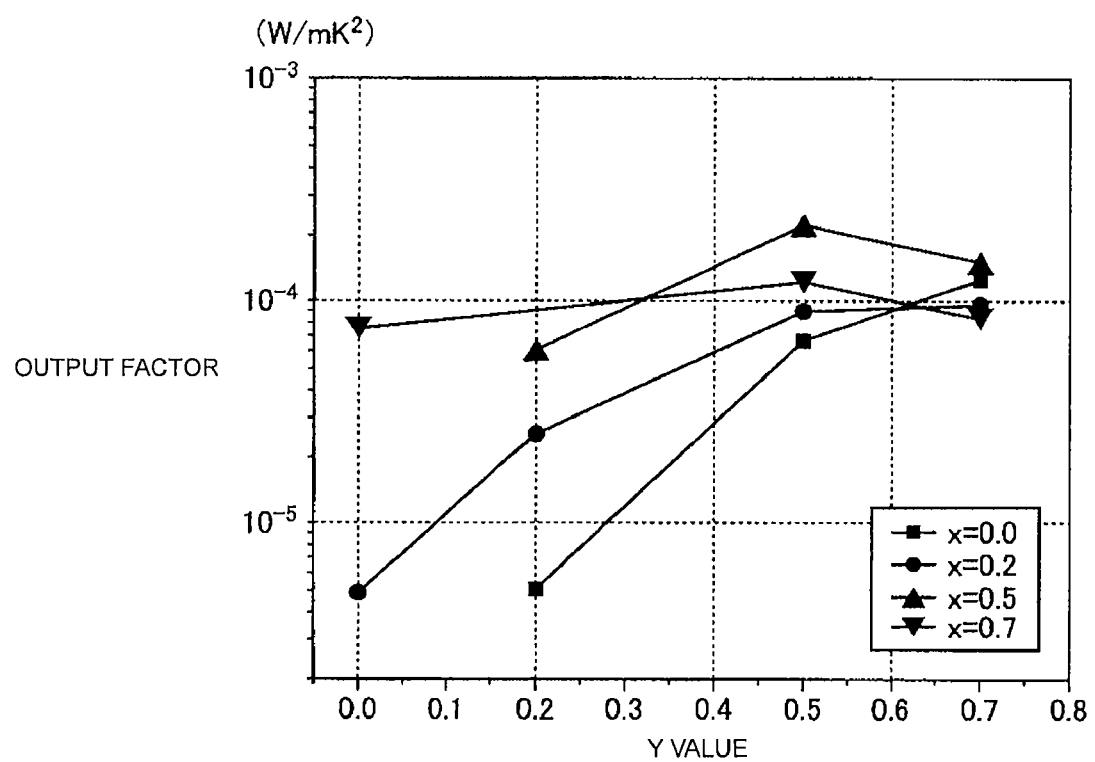
FIG. 2 is a graph showing the maximum values of output factor at the respective compositional ratios x and y with respect to the sintered bodies prepared in Example of the present invention.
Figure 3:
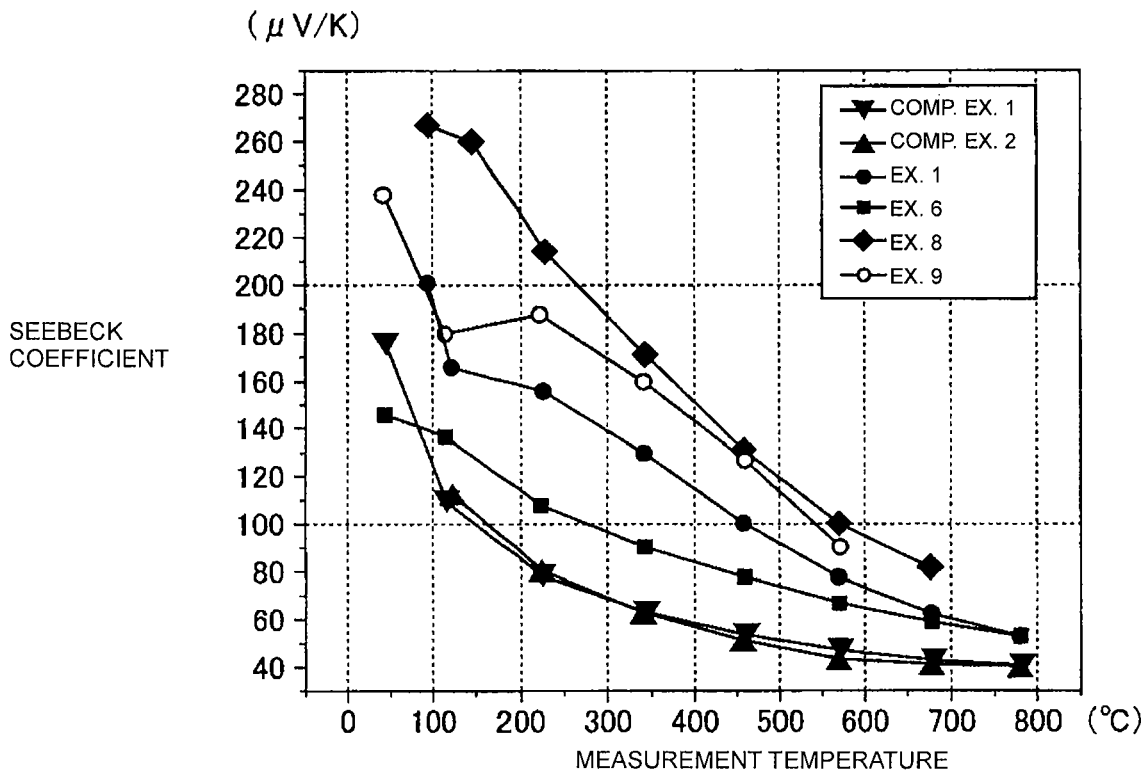
FIG. 3 is a graph showing the Seebeck coefficients in a range of 50° C. to 800° C. with respect to the sintered bodies prepared in Example of the present invention.
Figure 4:
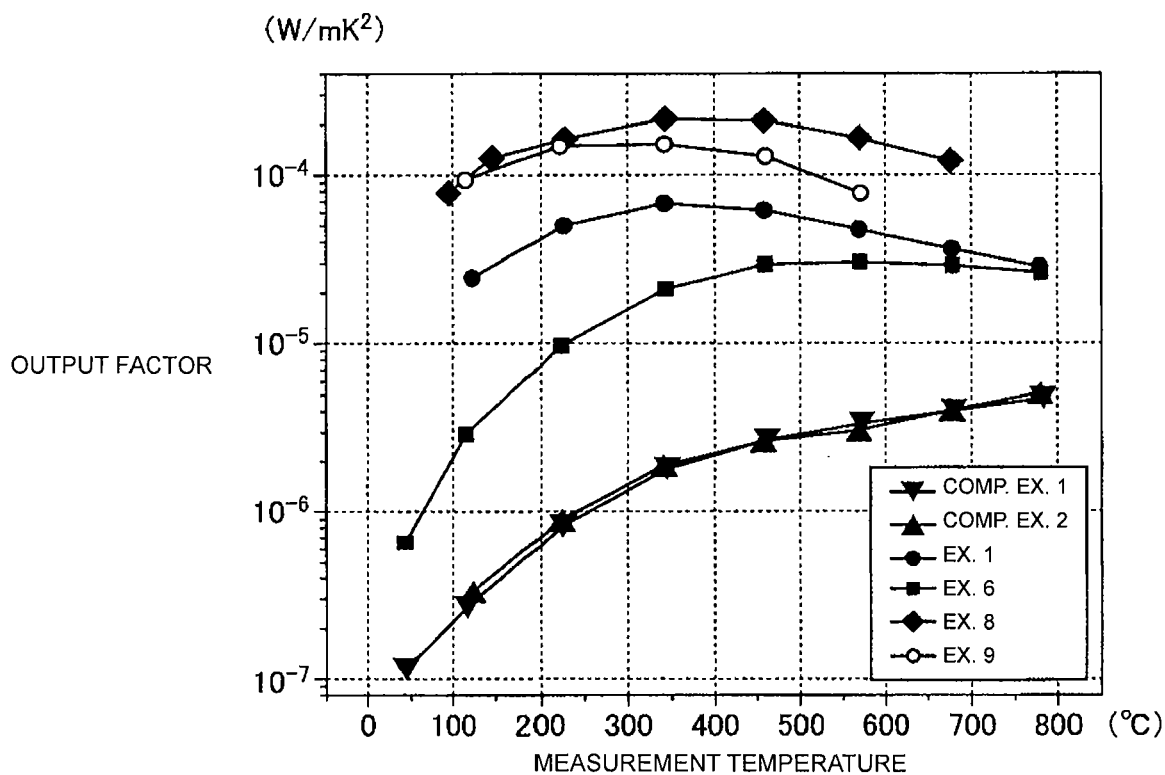
FIG. 4 is a graph showing the output factors in a range of 50° C. to 800° C. with respect to the sintered bodies prepared in Example of the present invention.

On the basis of the data shown in Table 1, FIG. 2 shows the maximum values of output factor at the respective compositional ratios x and y. Furthermore, FIG. 3 shows the Seebeck coefficients in a range of 50° C. to 800° C. with respect to the sintered bodies $(Ni_{1-x}Cu_x)(Mn_{2-y}Cu_y)O_4$ wherein x was varied in the range of 0.0 to 0.7 and y was varied in the range of 0.0 to 0.7. FIG. 4 shows the output factors in a range of 50° C. to 800° C. with respect to sintered bodies $(Ni_{1-x}Cu_x)(Mn_{2-y}Cu_y)O_4$ wherein x was varied in the range of 0.0 to 0.7 and y was varied in the range of 0.0 to 0.7.

As shown in Table 1 and FIG. 4, the output factors in Examples were higher than those in Comparative Examples in each temperature region. Furthermore, as is evident from the results in Comparative Example 2 and Example 6 or the results in Examples 1, 8, and 9, when $0.2 \leq x$ and as the x value increased, the output factor increased. Furthermore, as is evident from the results in Comparative Example 1 and Example 1 or the results in Examples 6 and 9, when $0.2 \leq y$ and as the y value increased, the output factor increased. Furthermore, as is evident from the results in Examples 1, 8, and 9, the thermoelectric materials with an output factor of $10 \times 10^{-6}$ W/mK$^2$ or more at 50° C. to 800° C. had a high output factor, the temperature dependence was low, and the output factors are level between the temperature regions.

As shown in Table 1 and FIG. 3, the Seebeck coefficients in Examples tended to be higher than those in Comparative Examples in each temperature region. Furthermore, as is evident from the results in Examples 1, 8, and 9, by replacing 50% of Ni with Cu, the Seebeck coefficient increased in each temperature region from 50° C. to 800° C. Furthermore, as is evident from the results in Examples 6, 8, and 9, by replacing about 50% of Mn by Cu, the Seebeck coefficient improved significantly in each temperature region from 50° C. to 800° C.

Furthermore, as is evident from the results of Table 1 and FIG. 2, when $0 \leq x$, $0 \leq y$, and $0.4 \leq x+y$, the output factor increased. Furthermore, when $y \leq 0.2$, as the x value increased, the output factor increased.

As shown in Table 1, as is evident from the results in Examples 8, 9, 12, and 13, when $x+y \leq 1.2$ and as the value x+y decreased, the output factor increased. Meanwhile, as is evident from the results in Example 3 and Comparative Examples 1 and 2 or the results in Examples 3, 4, 5, and 7, when $0.4 \leq x+y$, furthermore $0.7 \leq x+y$, and as the value x+y increased, the output factor increased.

The examples disclosed herein are to be considered as illustrative and not restrictive at all points. The scope of the present invention is defined not by the above-mentioned description but by the claims, and includes all equivalents to the scope of the claims and all modifications within the scope.

The invention claimed is:

1. A thermoelectric material comprising an oxide represented by the compositional formula $(Ni_{1-x}Cu_x)(Mn_{2-y}Cu_y)O_4$ and having a structure in which at least one of Ni elements occupying the Ni sites and Mn elements occupying the Mn sites are partially replaced by Cu elements, wherein $0.2 \leq x \leq 0.5$, $0.2 \leq y \leq 0.5$, and $0.4 \leq x+y$.

2. The thermoelectric material according to claim 1, wherein the output factor at 50° C. to 800° C. is $10 \times 10^{-6}$ W/mK$^2$ or more.

3. The thermoelectric material according to claim 1, wherein $0.5 \leq x+y$.

4. The thermoelectric material according to claim 1, wherein $0.7 \leq x+y$.

5. The thermoelectric material according to claim 1, wherein $x+y \leq 1.0$.

6. The thermoelectric material according to claim 1, wherein $0.5 \leq x+y \leq 1.0$.

7. The thermoelectric material according to claim 1, wherein $0.7 \leq x+y \leq 1.0$.

8. The thermoelectric material according to claim 1, wherein approximately 50% of the Ni elements are replaced by Cu.

9. The thermoelectric material according to claim 1, wherein approximately 50% of the Mn elements are replaced by Cu.

* * * * *